(12) United States Patent
Inaki et al.

(10) Patent No.: US 12,215,052 B2
(45) Date of Patent: Feb. 4, 2025

(54) SILICA GLASS DISC HAVING DIMPLES FORMED THEREON

(71) Applicant: SHIN-ETSU QUARTZ PRODUCTS CO., LTD., Tokyo (JP)

(72) Inventors: Kyoichi Inaki, Fukushima (JP); Akiyoshi Tsuchida, Tokyo (JP); Norikazu Fujii, Tokyo (JP)

(73) Assignee: SHIN-ETSU QUARTZ PRODUCTS CO., LTD., Tokyo (JP)

( * ) Notice: Subject to any disclaimer, the term of this patent is extended or adjusted under 35 U.S.C. 154(b) by 391 days.

(21) Appl. No.: 17/836,704

(22) Filed: Jun. 9, 2022

(65) Prior Publication Data

US 2022/0402812 A1 Dec. 22, 2022

(30) Foreign Application Priority Data

Jun. 17, 2021 (JP) ................................. 2021-100836

(51) Int. Cl.
*C03C 15/00* (2006.01)
*C23C 16/455* (2006.01)

(52) U.S. Cl.
CPC ........ *C03C 15/00* (2013.01); *C23C 16/45544* (2013.01)

(58) Field of Classification Search
None
See application file for complete search history.

(56) References Cited

U.S. PATENT DOCUMENTS

| | | | |
|---|---|---|---|
| 2006/0078839 A1* | 4/2006 | Adachi | H01L 21/68735 432/258 |
| 2015/0259799 A1* | 9/2015 | Motoyama | H01L 21/02274 438/758 |
| 2015/0376789 A1* | 12/2015 | Motoyama | H01L 21/0228 118/725 |
| 2021/0230041 A1* | 7/2021 | Gindele | C03B 33/02 |

FOREIGN PATENT DOCUMENTS

JP 2015173154 A 10/2015
TW 202031617 A 9/2020

* cited by examiner

*Primary Examiner* — David Sample
(74) *Attorney, Agent, or Firm* — McGlew and Tuttle, P.C.

(57) ABSTRACT

Provided is a silica glass disc in which the deformation amount thereof in heat treatment is minimized, and the surface area of a silica glass surface can be increased. There is provided a silica glass disc, including a dimple forming area in which a large number of dimples are formed on at least one of a front surface or a back surface of a silica glass body, and the dimples in the dimple forming area are regularly formed. It is preferred that the dimples be formed by a laser.

12 Claims, 9 Drawing Sheets

FIG.1 (a)

Case of quadrangle (□)

FIG.1 (b)

FIG.2(a)
Case of triangle (△)

SILICA GLASS DISC HAVING DIMPLES FORMED THEREON

BACKGROUND OF THE INVENTION

1. Field of the Invention

The present invention relates to a silica glass disc in which dimples are regularly formed on a silica glass surface.

2. Description of the Related Art

In general, in a semiconductor manufacturing process, a Si wafer is heated by a heat treatment device using quartz glass, to thereby subject the surface of the Si wafer to thin film treatment. In recent years, a thin film treatment method is being switched from a chemical vapor deposition (CVD) method to an atomic layer deposition (ALD) method. This is because the film thickness of a thin film to be formed on the Si wafer becomes as small as several hundred angstroms, and it is required to control variations in film thickness on the Si wafer between a center portion and a peripheral edge portion so that the variations become 10 Å or less, several angstroms or less in a severe case. Because of this, a dummy wafer to be arranged on each of an upper stage side and a lower stage side of the Si wafer used as a product is also required to have a surface area similar to that of the product.

The refinement in semiconductors has progressed, and a Si wafer and a silica glass disc each having irregularities on the surface are being used as dummy wafers. However, the Si wafer has a problem in that the Si wafer needs to be taken out at the time of cleaning, and hence in recent years, the silica glass disc is beginning to be actively used in place of the dummy wafer.

In Patent Document 1, a gas distribution adjusting member made of quartz has been proposed. There has been proposed that the surface of the quartz member has a surface area substantially equal to a surface area of a product wafer and that the surface area is required to be equal to or larger than 0.8 time the surface area of the product wafer.

However, in actuality, the following has been found out. In the Si wafer and the silica glass disc, due to the difference in mechanical characteristics such as a Young's modulus and a Poisson's ratio, when the Si wafer and the silica glass disc are set on a holder for holding the Si wafer and the silica glass disc in a shelf shape, a difference in deformation amount occurs in a distal end portion of the disc. Unless irregularities are formed on the silica glass disc in consideration of such deformation amount, there is a risk in that the deformation may be accelerated. When the deformation amount becomes larger, a difference in gap between the Si wafer and the silica glass disc occurs between the central portion and the distal end, with the result that a slight difference occurs in the flow amount of gas. Such slight difference in gap causes a subtle difference also in a film thickness on the actual Si wafer, and the variations in film thickness of a thin film within the Si wafer surface are increased to cause problems.

In addition, in a sectional view of the gas distribution adjusting member made of quartz, irregularities that are vertically formed are illustrated. However, there are the following problems. In the case of the vertical irregularities, when a film adheres thereto, the film is liable to peel off. In addition, when a corner portion having a right angle is formed, breakage is liable to occur from the corner portion.

PRIOR ART DOCUMENTS

Patent Document

Patent Document 1: Japanese Patent Application Laid-open No. 2015-173154

SUMMARY OF THE INVENTION

The present invention has an object to provide a silica glass disc in which the deformation amount thereof in heat treatment is minimized, and the surface area of a silica glass surface can be increased.

In order to solve the above-mentioned problems, the inventors of the present invention have made extensive investigations on the variations of a thin film, and as a result, have found out that the deformation amount of a silica glass disc in heat treatment can be minimized by forming regular dimples on the silica glass disc and that the surface area of a silica glass surface can be increased by forming an irregular surface having a dimple shape.

That is, according to at least one embodiment of the present invention, there is provided a silica glass disc, including a dimple forming area in which a large number of dimples are formed on at least one of a front surface or a back surface of a silica glass body, wherein the dimples in the dimple forming area are regularly formed.

It is preferred that the dimples be formed by a laser.
It is preferred that the laser be at least one kind selected from the group consisting of a $CO_2$ laser, a picosecond laser and a femtosecond laser.

Further, it is preferred that the dimples be formed by causing laser light to scan predetermined points on an XY-axis through use of a galvano scanner.

It is preferred that the dimples be formed on the front surface and the back surface of the silica glass body.

The dimple forming area may have a center portion and a peripheral edge portion that are different in density of the dimples.

It is preferred that the dimples each have one of an inverted cone shape, an inverted truncated cone shape or a bent shape in which an end of a dimple bottom portion and a dimple side wall are prevented from having a right angle.

It is preferred that the silica glass body be one of transparent silica glass, white silica glass or black silica glass.

When the dimples are formed on the back surface of the silica glass body, it is preferred that the dimple forming area on the back surface of the silica glass body be formed at a distance of 10 mm or more from an end portion of the silica glass disc.

When the silica glass disc is used in a heat treatment process in a vertical heat treatment device, a deformation amount generated at a distal end of the peripheral edge portion of the silica glass disc can be 1 mm or less.

It is preferred that the heat treatment process be a heat treatment process applied when film formation treatment is performed by an ALD method.

The silica glass disc is preferably used in place of a Si dummy wafer.

According to the present invention, there can be provided the silica glass disc in which the deformation amount thereof in heat treatment is minimized, and the surface area of the silica glass surface can be increased.

In addition, according to the present invention, by regularly forming the dimples having no directivity on the silica glass disc, the deformation amount at the distal end of the silica glass disc can be reduced when the silica glass disc is used in place of a dummy wafer for a vertical heat treatment furnace.

Further, when the dimples are regularly formed on the silica glass surface, the silica glass disc can also have a predetermined surface area as a gas distribution adjusting member, and the film thickness distribution of a thin film to be formed on the surface of a Si wafer can be made further uniform.

BRIEF DESCRIPTION OF THE DRAWINGS

FIG. 1(a) and FIG. 1(b) show a silica glass disc according to one embodiment of the present invention.

FIG. 2(a) and FIG. 2(b) show the silica glass disc according to another embodiment of the present invention.

DESCRIPTION OF THE EMBODIMENTS

Embodiments of the present invention are described below with reference to the attached drawings. It goes without saying that illustrated examples are merely described as examples and various modifications may therefore be made without departing from the technical concept of the present invention.

A silica glass disc of the present invention includes a dimple forming area in which a large number of dimples are formed on at least one of a front surface or a back surface of a silica glass body, and the dimples in the dimple forming area are regularly formed. In the present invention, the dimples mean recesses each having a dimple shape formed on the front surface and/or the back surface of the silica glass disc. Further, in the present invention, the dimple shape refers to an independent recess formed on a flat surface of the silica glass disc in which a portion in contact with the flat surface has a substantially circular shape, and the recess is not in contact with an adjacent recess.

By regularly forming the dimples on the silica glass disc, the deformation amount of the silica glass disc can be minimized. Further, by forming an irregular surface having a dimple shape, the surface area of a silica glass surface can be increased.

The silica glass disc of the present invention is preferably used in place of a Si dummy wafer. In particular, the silica glass disc of the present invention is used preferably in place of a dummy wafer in a heat treatment process in a vertical heat treatment device, and it is more preferable to use the silica glass disc in place of a dummy wafer in a heat treatment process applied when film formation treatment is performed by an ALD method.

When the silica glass disc is set on a vertical heat treatment device, for example, a shelf-shaped holder and used in a heat treatment process (300° C. to 700° C.), the deformation amount at a distal end of a peripheral edge portion of the silica glass disc can be made to 1 mm or less. The deformation amount at the distal end of the peripheral edge portion of the silica glass disc is more preferably 1 mm or less, still more preferably 0.5 mm or less. When the deformation amount is more than 1 mm, the variations of a thin film on the surface of a Si wafer become large, and the influence therefrom causes problems.

It has been known that, when the silica glass disc and the Si wafer are set on the shelf-shaped holder, a difference in deformation amount occurs even when dimples are not formed on the surface of the silica glass disc. It has been known that the Si wafer is less liable to be deformed as compared to the silica glass disc due to the Young's modulus and the Poisson's ratio that are larger than those of the silica glass disc. In order to reduce the deformation amount, it is important that the dimples be regularly arranged under a state without directivity. For example, when linear shapes with directivity such as grooves described in Patent Document 1 are formed on the surface of the silica glass disc, it is important that the direction of deformation and the direction in which the grooves are formed be orthogonal to each other so that the deformation at the distal end of the silica glass disc is not accelerated. However, when the direction of the grooves and the direction of the deformation overlap each other, the deformation may be accelerated, and the deformation amount may become 2 mm or more. Also in order to reduce such risk, it is necessary that shapes without directivity such as the dimples be formed on a silica glass surface.

There is no particular limitation on a method of forming dimples, but it is preferred that the dimples be formed by a laser. In particular, in order to increase the surface area, it is required to form a large number of dimples on the silica glass surface, and it is also required to stabilize the shape of each of the dimples. Accordingly, it is preferred to use laser light for forming several ten thousand to one hundred thousand dimples.

Although the kind of laser light is not especially limited, there may be used a $CO_2$ laser or a picosecond laser or a femtosecond laser using second harmonics or third harmonics of a YAG laser.

At the time of irradiation with laser light, it is preferred to control the irradiation position of the laser light through use of a control device such as a galvano scanner capable of performing multi-axis (for example, two-dimensional XY-axis or three-dimensional XYZ-axis) control. A biaxial galvano scanner is an XY deflection unit that deflects and collects the laser light two-dimensionally in an X-direction and a Y-direction, and performs laser scanning at predetermined positions of a two-dimensional area. When the laser light is caused to scan the predetermined points on the XY-axis through use of the galvano scanner, the entire silica glass surface can be subjected to dimple processing.

There is no particular limitation on the material for the silica glass body to be used as long as the material is silica glass. Any of natural silica glass and synthetic silica glass may be used, but high-purity synthetic silica glass is more preferably used. In particular, silica glass having a $SiO_2$ composition amount of from 99.99 mass % to 100 mass % is more preferred.

There is no particular limitation on the color and transparency of the silica glass body. For example, transparent silica glass, white silica glass, black silica glass or the like is preferably used, and it is only required that the color and transparency be appropriately selected in consideration of the intended use. The workability of dimple formation remains unchanged with any of those silica glasses, and hence the dimples can be formed by similar means.

For example, a white silica glass disc may be created by a slip casting method involving adding a solvent to silica fine particles to form a slurry and pouring the slurry into a mold. Also, in the case of black silica glass, it is only required that a black additive, for example, powder of C, SiC, Si, SiO or the like may be added to the slurry to color the slurry.

The silica glass disc of the present invention is a silica glass body having a circular front surface and a circular back surface.

When the silica glass disc is used in place of a dummy wafer, it is desired that the silica glass disc have the same shape as that of a Si wafer, but the thickness of the silica glass disc becomes slightly larger than that of the Si wafer in order to match the weight of the silica glass disc with that of the Si wafer. In addition, the weight of the silica glass body varies also depending on the density of the dimples on the surface, and hence the thickness of the silica glass body may also be made larger than that of the Si wafer in order to match the weight of the silica glass body with that of the Si wafer.

FIG. 1(a) and FIG. 1(b) show a silica glass disc 10 according to one embodiment of the present invention, and are each a schematic overall view of a main part for illustrating a mode in which dimples 12 are arranged at apexes of imaginary quadrangles 14. FIG. 2(a) and FIG. 2(b) show the silica glass disc 10 according to another embodiment of the present invention, and are each a schematic overall view of a main part for illustrating a mode in which the dimples 12 are arranged at apexes of imaginary triangles 16.

In the present invention, the regular formation of dimples means that the dimples are formed in regular arrangement in accordance with a predetermined rule. There is no particular limitation on the arrangement of the dimples as long as the dimples are regularly formed. However, as illustrated in FIG. 1(a) and FIG. 1(b), it is preferred that the dimple forming area be formed of the repetition of a dimple structure unit in which the dimples are regularly formed, and the dimple structure unit be formed of the dimples arranged at the apexes of the imaginary quadrangles 14. In addition, it is preferred that a design having directivity (see Comparative Example 1) such as a groove shape of the related art be avoided to the extent possible.

Figure 1:
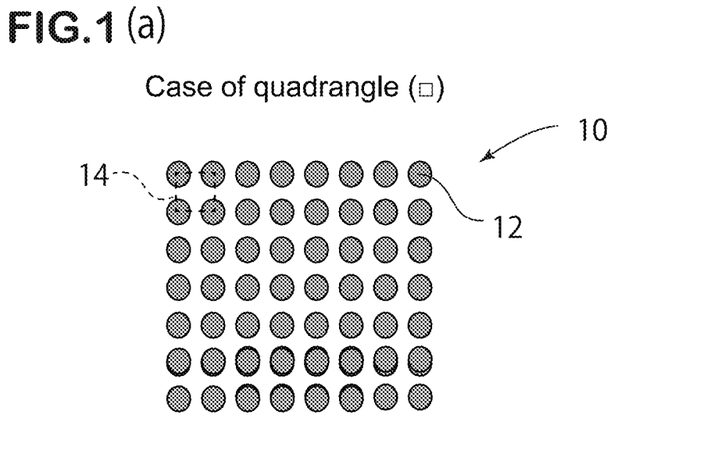
FIG. 1(a) is a schematic pattern diagram of a main part for illustrating a mode in which dimples are arranged at apexes of imaginary quadrangles.
FIG. 1(b) is a partially enlarged view of FIG. 1(a).
Figure 2A:
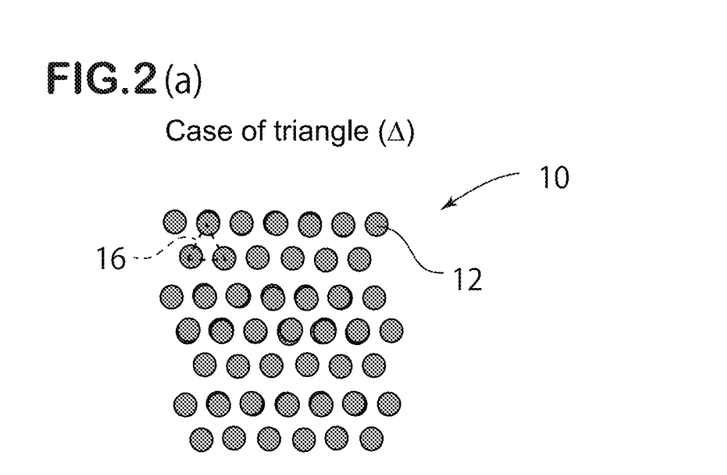
FIG. 2(a) is a schematic pattern diagram of a main part for illustrating a mode in which the dimples are arranged at apexes of imaginary triangles.
Figure 2B:
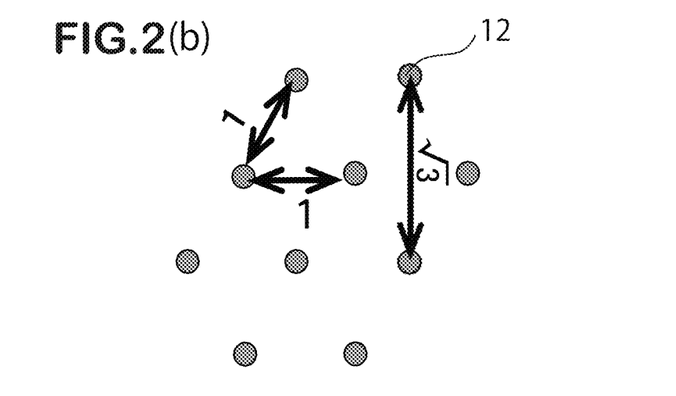
FIG. 2(b) is a partially enlarged view of FIG. 2(a).

In simple comparison between the case in which the dimples 12 are arranged under a state of the imaginary quadrangles (□) [FIG. 1] and the case in which the dimples 12 are arranged under a state of the imaginary triangles (Δ) [FIG. 2], there is a subtle difference that is ignorable under the conditions in which gas adhesion characteristics are not strictly required. However, under the conditions in which the gas adhesion characteristics are strictly required, when the dimples are arranged under the state of the imaginary triangles (Δ) as illustrated in FIG. 2(a) and FIG. 2(b), there are a direction and the like in which the distance between the dimples is partially long depending on the direction of the silica glass disc, with the result that the burden in which the direction of the silica glass disc is required to be constantly fixed may be caused.

When the dimples 12 are arranged under the state of the imaginary quadrangles (□) as illustrated in FIG. 1(b), the maximum ratio of the distance between the surrounding dimples to the shortest distance is $\sqrt{2}$. However, when the dimples 12 are arranged under the state of the imaginary triangles (Δ) as illustrated in FIG. 2(b), the maximum ratio of the distance between the surrounding dimples to the shortest distance is $\sqrt{3}$. Accordingly, there is a direction in which the distance between the dimples is partially long depending on the direction of the silica glass disc, and hence directivity slightly appears. For this reason, under the conditions in which the gas adhesion characteristics are strictly required, it is required to constantly fix the direction of the silica glass disc. Even with the foregoing, when the dimples 12 are arranged under the state of imaginary triangles (Δ), this configuration is not a design with clear directivity as in the groove shape of the prior art, and hence no serious problems are caused under the conditions in which the gas adhesion characteristics are not strictly required.

Even when the dimples are arranged under the state of the quadrangles (□), the distance between the dimples becomes partially long depending on the direction. However, the distance does not become so long as that in the case of the triangles (Δ), and the degree of freedom in directionality is large regarding the direction of the silica glass disc. Accordingly, it is preferred that the dimples be arranged at the apexes of the imaginary quadrangles as illustrated in FIG. 1(a) and FIG. 1(b), and it is more preferred that the dimples be arranged at the apexes of the imaginary squares.

In the silica glass disc, the dimple forming area may be formed on any of the front surface and the back surface of the silica glass body, or may be formed on both the front surface and the back surface. The formation of the dimples is basically one method of increasing the surface area. However, when irregularities are mechanically formed on both the surfaces, there is a risk in that the silica glass body may be fractured at the time of processing for forming the irregularities. Meanwhile, when the irregularities are formed through use of a laser as in the dimples in the present invention, the mechanical processing is not required, and hence this formation method is convenient for forming an irregular surface on both the surfaces.

Figure 7A:
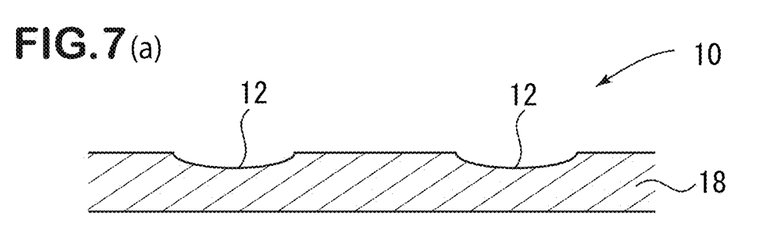
FIG. 7(a) and FIG. 7(b) are each a partial transverse sectional view for illustrating one embodiment of the silica glass disc according to the present invention illustrated in FIG. 1(a) and FIG. 1(b).
Figure 7B:
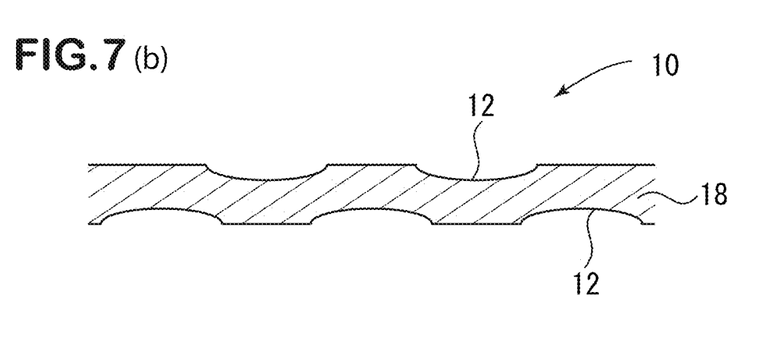
Figure 8:
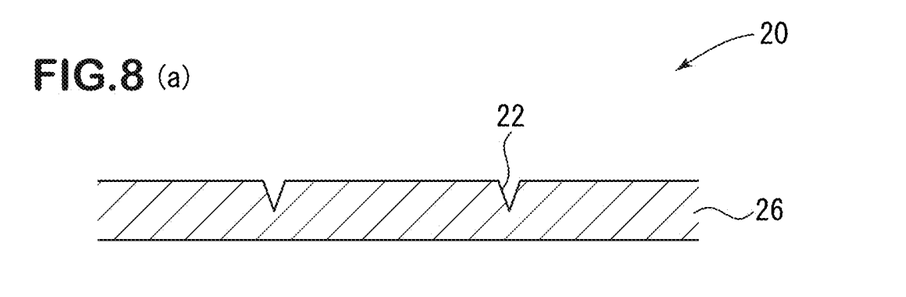
FIG. 8(a) and FIG. 8(b) are each a partial transverse sectional view for illustrating another embodiment of the silica glass disc according to the present invention illustrated in FIG. 1(a) and FIG. 1(b).
Figure 9:
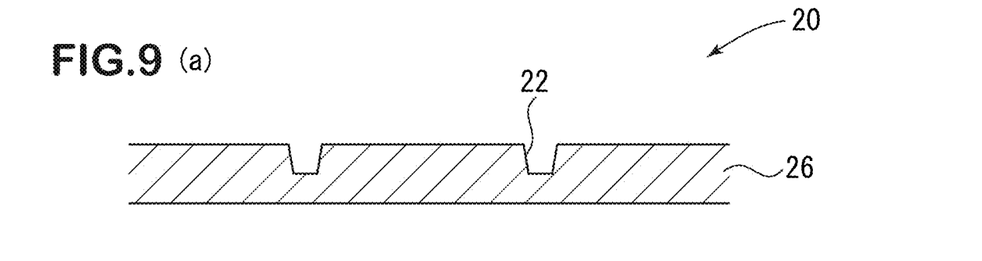
FIG. 9(a) and FIG. 9(b) are each a partial transverse sectional view for illustrating still another embodiment of the silica glass disc according to the present invention illustrated in FIG. 1(a) and FIG. 1(b).

FIG. 7(a) and FIG. 7(b) are each a partial transverse sectional view for illustrating one embodiment of the silica glass disc according to the present invention illustrated in FIG. 1(a) and FIG. 1(b). In FIG. 7(a), there is illustrated an example in which the dimples 12 are each formed so that an end of a dimple bottom portion and a dimple side wall have a bent shape, and the silica glass disc 10 has a configuration in which the dimples 12 are regularly formed only on the front surface of a silica glass body 18. In FIG. 7(b), the silica glass disc 10 has a configuration in which the dimples 12 are regularly formed on both the front surface and the back surface of the silica glass body 18.

In addition, there is no particular limitation on the arrangement in which the dimple forming area is formed in the silica glass disc. However, when the silica glass disc is used in place of a dummy wafer, it is preferred that the dimple forming area be formed at least in a central portion of the silica glass disc. The central portion of the silica glass disc is the center portion of the silica glass disc or a region including the vicinity of the center portion, and the central portion is located within a range of preferably 80% or more, more preferably 90% or more of the silica glass disc.

In addition, when the silica glass disc is used in place of a dummy wafer, it is preferred that the dimple forming area not be formed in a peripheral edge portion of the back surface of the silica glass disc or that the density of the dimples be reduced in the peripheral edge portion as compared to that in the central portion of the silica glass disc. The peripheral edge portion of the silica glass disc is an end portion of the disc or a region including the end portion. For example, in the case of a disc having a diameter of 300 mm, the peripheral edge portion of the back surface of the silica glass disc is located within a range of preferably at least 15 mm from the end of the disc, more preferably at least 10 mm from the end of the disc.

When the silica glass disc is used in place of a dummy wafer in the heat treatment process in the vertical heat treatment device, deformation occurs at the distal end of the shelf-shaped silica glass disc. In order to reduce the deformation amount, it is important that dimples not be formed in a width of 10 mm of the peripheral edge portion of the back surface of the silica glass disc. When the dimples are formed in this portion, the deformation in a distal end portion is accelerated. The reason for the acceleration of the deformation is not clear, but it is conceived that, when the dimples are formed in this portion, the thickness of the silica glass disc partially becomes smaller, and the deformation mode is accelerated. The dimple shapes are arranged from the center to the distal end, and hence the deformation mode of each of the dimples influences a portion including the distal end. However, when a region in which the dimples are not formed is formed at least in a width of 10 mm of the peripheral edge portion, the influence of the deformation mode of each of the dimples is shut off once, thereby being capable of reduce the deformation amount.

There is no particular limitation on the density of the dimples in the dimple forming area. The dimples may be uniformly present, or the density of the dimples may vary depending on a part of the silica glass disc. Even when the density of the dimples varies depending on a part of the silica glass disc, there is no particular regulation on the shape of each of the dimples.

There is no particular limitation on the number of the dimples in the silica glass disc, but the number of the dimples in the central portion of the silica glass disc is preferably from 100,000 to 2,000,000, more preferably 500,000 to 1,000,000. In addition, the above-mentioned ranges are similarly applied also to the number of the dimples in the peripheral edge portion, but the number of the dimples in the center portion may be larger or smaller than that in the peripheral edge portion in accordance with the conditions. It is preferred that the number (density) of the dimples in the peripheral edge portion of the back surface of the silica glass disc be 0.

There is no particular limitation on the size of each of the dimples. However, the dimples each have a hole diameter of preferably from 50 μm to 500 μm, more preferably from 200 μm to 400 μm. In addition, the depth of each of the dimples is preferably from 10 μm to 1,000 μm, more preferably from 200 μm to 600 μm. As a specific example of the dimples, for example, dimples adjusted to a hole diameter of several hundred micrometers and a depth of several hundred micrometers are preferred.

There is no particular limitation on the shape of each of the dimples. However, it is preferred that the dimples be each formed into an inverted cone shape, an inverted truncated cone shape or a bent shape in which an end of a dimple bottom portion and a dimple side wall do not have a right angle.

FIG. 8(a) and FIG. 8(b), and FIG. 9(a) and FIG. 9(b) are each a partial transverse sectional view for illustrating another embodiment of the silica glass disc according to the present invention. In each of FIGS. 8(a) and 8(b), there is illustrated an example in which a silica glass disc 20 has a configuration in which dimples 22 formed on a silica glass body 26 each have an inverted cone shape. In addition, in each of FIG. 9(a) and FIG. 9(b), there is illustrated an example in which the dimples 22 each have an inverted truncated cone shape. In each of FIG. 8(a) and FIG. 9(a), the silica glass disc 20 has a configuration in which the dimples 22 are regularly formed only on the front surface of the silica glass body 26. In each of FIG. 8(b) and FIG. 9(b), the silica glass disc 20 has a configuration in which the dimples 22 are regularly formed on both the front surface and the back surface of the silica glass body 26.

As used herein, the term "silica glass surface" refers to the surface of silica glass itself, and is a concept that may include both the front surface and the back surface of the silica glass body. It is preferred that the silica glass disc of the present invention be used under the condition of being placed on a shelf-shaped holder or the like. As used herein, regarding the front surface and the back surface of the silica glass disc, the side to be an upper surface side and the side to be a lower surface side at the time of placement on the shelf-shaped holder or the like are referred to as "front surface" and "back surface", respectively.

The inventors of the present invention have made extensive investigations on the irradiation conditions of a laser and the like, and as a result, have fortunately found out the following. In the dimples formed by a laser, the power of the laser has a distribution in a depth direction, and hence it is recognized that the power on an opening portion side tends to be large and the power on a bottom surface side tends to be gradually decreased. Because of this, the dimples formed by a laser are each naturally formed into an inverted cone shape, and further, the corner portion of a bottom surface can be formed into a round shape. As a result, unlike the groove shape as in the related art and the irregular shape formed by sandblasting, while the effect of causing gas to be adsorbed in those dimples is maintained, a film formed with gas is less liable to peel off even when the film adheres to the silica glass surface, and the formation of cracks and the risk of breakage can be reduced because a sharp corner portion is not formed. Further, when the film deposited with the gas is cleaned, the deposited film can cleanly be removed because the gas has been uniformly supplied into the dimples.

EXAMPLES

Now, the present invention is more specifically described by way of Examples. It goes without saying that Examples are given for illustrative purposes and should not be interpreted as limiting the present invention.

Example 1

800,000 dimples each having a hole diameter of from 200 μm to 250 μm and a depth of 200 μm were uniformly created through use of a $CO_2$ gas laser so that the dimples were regularly arranged at apexes of imaginary quadrangles over the entire front surface of a silica glass body of a transparent synthetic silica glass disc (diameter: 300 mm, thickness: 1.5 mm). At the time of irradiation with laser light, a biaxial galvano scanner (manufactured by Raylase GmbH) which is an XY deflection unit that deflects and collects a laser beam two-dimensionally was used as a control device. The $CO_2$ gas laser was caused to scan the surface of the silica glass body through use of the galvano scanner, and hence about one hour and a half were required for forming the dimples on the surface.

Regarding the back surface of the silica glass body, the dimples were created under the same conditions as those for the front surface so that the dimples were not formed in a range of 10 mm (peripheral edge portion) from an end portion of the synthetic silica glass disc, and as a result, 700,000 dimples each having a hole diameter of from 200 µm to 250 µm and a depth of 200 µm were uniformly formed in a central portion (portion other than the peripheral edge portion) of the back surface of the synthetic silica glass disc.

Figure 3:
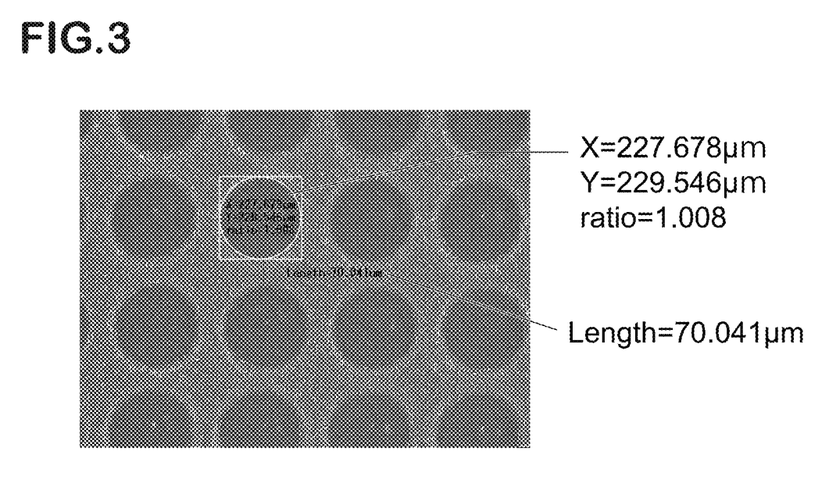
FIG. 3 shows results of a micrograph of a surface of a silica glass body of a silica glass disc of Example 1.

A micrograph of the front surface of the silica glass body of the obtained silica glass disc having the dimples formed on both the surfaces is shown in FIG. 3. As shown in FIG. 3, a large number of dimples, which were regularly arranged at the apexes of the imaginary quadrangles, were formed on the front surface and the back surface of the silica glass body of the silica glass disc. In addition, the formed dimples each had an inverted cone shape.

Figure 4:
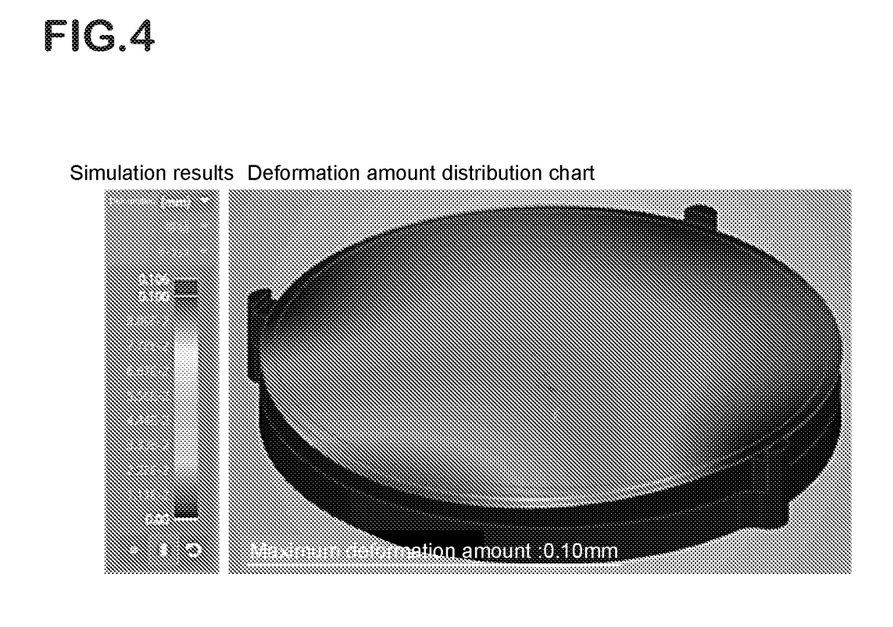
FIG. 4 is an explanatory diagram for showing simulation results of a deformation amount distribution chart of the silica glass disc of Example 1.

The obtained silica glass disc having the dimples formed on both the surfaces was placed on a shelf-shaped holder and subjected to heat treatment (550° C.). After that, the deformation amount of a distal end portion was measured. For measurement, a height gauge was used. The actual measurement results are shown in Table 1, and the simulation results of a deformation amount distribution are shown in FIG. 4.

Example 2

500,000 dimples each having a hole diameter of from 200 µm to 250 µm and a depth of 400 µm were uniformly created through use of a $CO_2$ gas laser over the entire front surface of a silica glass body of a natural silica glass disc (diameter: 300 mm, thickness: 1.5 mm). The $CO_2$ gas laser was caused to scan the surface of the silica glass body through use of the galvano scanner, and hence about one hour was required for forming the dimples on the surface.

Regarding the back surface of the silica glass body, the dimples were created under the same conditions as those for the front surface so that the dimples were not formed in a range of 20 mm (peripheral edge portion) from an end portion of the natural silica glass disc, and as a result, 350,000 dimples each having a hole diameter of from 200 µm to 250 µm and a depth of 400 µm were uniformly formed in a central portion (portion other than the peripheral edge portion) of the back surface of the natural silica glass disc.

Figure 5:
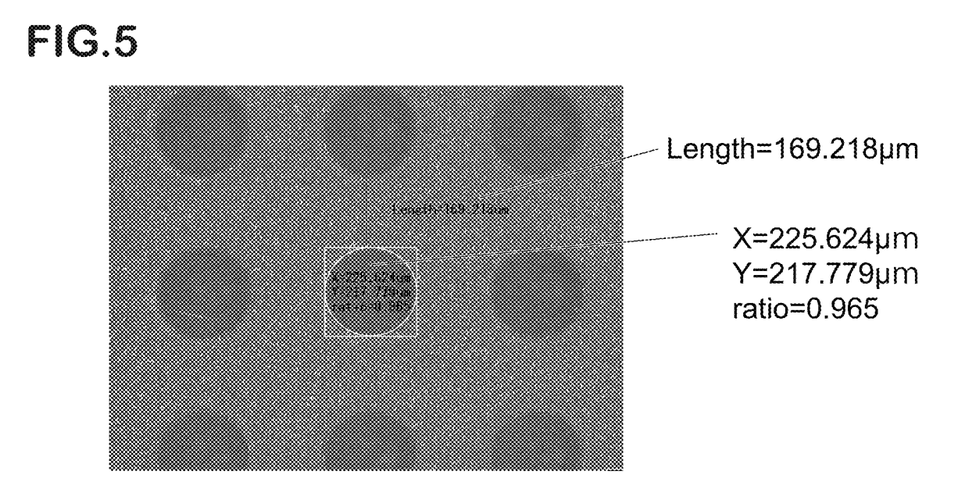
FIG. 5 shows results of a micrograph of a surface of a silica glass body of a silica glass disc of Example 2.

A micrograph of the front surface of the silica glass body of the obtained silica glass disc having the dimples formed on both the surfaces is shown in FIG. 5. As shown in FIG. 5, a large number of dimples, which were regularly arranged at the apexes of the imaginary quadrangles, were formed on the front surface and the back surface of the silica glass body of the silica glass disc. In addition, the formed dimples each had an inverted truncated cone shape.

In addition, the obtained silica glass disc having the dimples formed on both surfaces was subjected to heat treatment by the same method as that of Example 1, and the deformation amount of a distal end portion after the heat treatment was measured. The results are shown in Table 1.

Example 3

1,000,000 dimples each having a hole diameter of from 50 µm to 60 µm and a depth of 100 µm were uniformly created through use of a picosecond laser using second harmonics of a YAG laser over the entire front surface of a silica glass body of a white silica glass disc (diameter: 300 mm, thickness: 1.5 mm). The second harmonics of the YAG laser were caused to scan the surface of the silica glass body through use of a galvano scanner, and hence about three hours were required for forming the dimples on the surface.

Regarding the back surface of the silica glass body, the dimples were created under the same conditions as those for the front surface so that the dimples were not formed in a range of 15 mm (peripheral edge portion) from an end portion of the white silica glass disc, and as a result, 800,000 dimples each having a hole diameter of from 50 µm to 60 µm and a depth of 100 µm were uniformly formed in a central portion (portion other than the peripheral edge portion) of the back surface of the white silica glass disc.

A large number of dimples, which were regularly arranged at the apexes of the imaginary quadrangles, were formed on the front surface and the back surface of the silica glass body of the obtained white silica glass disc. In addition, the formed dimples each had an inverted cone shape.

The obtained silica glass disc having the dimples formed on both surfaces was subjected to heat treatment by the same method as that of Example 1, and the deformation amount of a distal end portion after the heat treatment was measured. The results are shown in Table 1.

Example 4

1,000,000 dimples each having a hole diameter of from 200 µm to 250 µm and a depth of 500 µm were created through use of a $CO_2$ gas laser on the front surface of a silica glass body of a transparent synthetic silica glass disc (diameter: 300 mm, thickness: 1.5 mm). In this case, 300,000 dimples were uniformly formed in a center portion (central portion) having a diameter of 200 mm, and 700,000 dimples were uniformly formed in a portion (peripheral edge portion) other than the portion having a diameter of 200 mm. Thus, the density of the dimples was set to be different between the central portion of the disc and the peripheral edge portion thereof. The $CO_2$ gas laser was caused to scan the surface of the silica glass body through use of the galvano scanner, and hence about one hour and a half were required for forming the dimples on the surface.

Regarding the back surface of the silica glass body, the dimples were created under the same conditions as those for the front surface so that the dimples were not formed in a range of 10 mm (peripheral edge portion) from an end portion of the synthetic silica glass disc, and as a result, 600,000 dimples each having a hole diameter of from 200 µm to 250 µm and a depth of 500 µm were uniformly formed in a central portion (portion other than the peripheral edge portion) of the back surface of the synthetic silica glass disc.

A large number of dimples, which were regularly arranged at the apexes of the imaginary quadrangles, were formed on the front surface and the back surface of the silica glass body of the obtained synthetic silica glass disc. In addition, the formed dimples each had an inverted cone shape.

The obtained silica glass disc having the dimples formed on both surfaces was subjected to heat treatment by the same method as that of Example 1, and the deformation amount of a distal end portion after the heat treatment was measured. The results are shown in Table 1.

Example 5

700,000 dimples each having a hole diameter of from 200 µm to 250 µm and a depth of 500 µm were created through use of a $CO_2$ gas laser on the front surface of a silica glass body of a transparent synthetic silica glass disc (diameter: 300 mm, thickness: 1.5 mm). In this case, 300,000 dimples were uniformly formed in a center portion (central portion) having a diameter of 200 mm, and 400,000 dimples were uniformly formed in a portion (peripheral edge portion) other than the portion having a diameter of 200 mm. Thus, the density of the dimples was set to be different between the central portion of the disc and the peripheral edge portion thereof. The $CO_2$ gas laser was caused to scan the surface of the silica glass body through use of the galvano scanner, and hence about one hour and a half were required for forming the dimples on the surface.

Regarding the back surface of the silica glass body, the dimples were created under the same conditions as those for the front surface so that the dimples were not formed in a range of 10 mm (peripheral edge portion) from an end portion of the synthetic silica glass disc, and as a result, 400,000 dimples each having a hole diameter of from 200 µm to 250 µm and a depth of 500 µm were uniformly formed in a central portion (portion other than the peripheral edge portion) of the back surface of the synthetic silica glass disc.

A large number of dimples, which were regularly arranged at apexes of imaginary triangles, were formed in the peripheral edge portion of the front surface and the back surface of the silica glass body of the obtained synthetic silica glass disc, and a large number of dimples, which were regularly arranged at apexes of imaginary quadrangles, were formed in the center portion of the surface. In addition, the formed dimples each had an inverted cone shape.

The obtained silica glass disc having the dimples formed on both surfaces was subjected to heat treatment by the same method as that of Example 1, and the deformation amount of a distal end portion after the heat treatment was measured. The results are shown in Table 1.

Comparative Example 1

400 grooves each having a width of from 200 µm to 250 µm and a depth of 400 µm were formed on a natural silica glass disc (diameter: 300 mm, thickness: 1.5 mm). The grooves were formed by a grooving machine, and hence 10 hours were required. The grooves were formed over the entire front surface and back surface of the silica glass body, and were formed also in the peripheral edge portion. Grooving requiring a long period of time is also a problem in that productivity is lowered.

Figure 6:
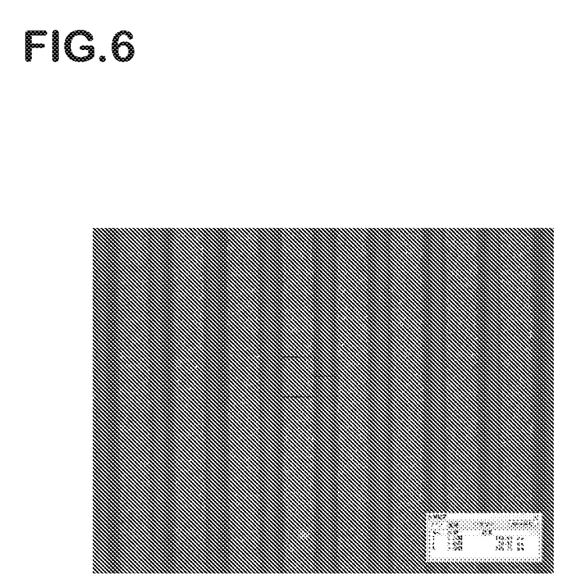
FIG. 6 shows results of a micrograph of a surface of a silica glass body of a silica glass disc of Comparative Example 1.

A micrograph of the front surface of the silica glass body of the obtained silica glass disc having the grooves formed on both the surfaces is shown in FIG. 6.

The obtained silica glass disc having the grooves formed on both surfaces was subjected to heat treatment by the same method as that of Example 1, and the deformation amount of a distal end portion after the heat treatment was measured. In Comparative Example 1, the deformation amount varied depending on the positional relationship between the direction in which the grooves were formed and the holder, and hence the measurement results based on the direction (horizontal and vertical directions) of the grooves were also obtained. The results are shown in Table 1.

Comparative Example 2

600 grooves each having a width of from 200 µm to 250 µm and a depth of 400 µm were formed, and 300 grooves each having the same groove width and the same groove depth as those of the 600 grooves were formed so as to be orthogonal to the 600 grooves, though use of a grooving machine on a synthetic silica glass disc (diameter: 300 mm, thickness: 1.5 mm). The grooves were formed only on the front surface of the silica glass body, and the grooves were similarly formed also in the peripheral edge portion.

The obtained silica glass disc having the grooves formed on the surface of the silica glass body was subjected to heat treatment by the same method as that of Comparative Example 1, and the deformation amount of a distal end portion after the heat treatment was measured. However, when grooving was performed, most of the grooves came off to make it difficult to measure the deformation amount.

TABLE 1

| | Deformation amount in distal end portion of silica glass disc |
|---|---|
| Example 1 | 100 µm |
| Example 2 | 300 µm |
| Example 3 | 700 µm |
| Example 4 | 500 µm |
| Example 5 | 800 µm |
| Comparative Example 1 | 1,200 µm (Case of horizontal direction) |
| Comparative Example 1 | 800 µm (Case of vertical direction) |
| Comparative Example 2 | Difficult to measure |

As shown in Table 1, in each of the silica glass discs of Examples 1 to 4 in which the dimples were regularly formed, the deformation amount of the distal end portion of the silica glass disc was able to be significantly reduced.

What is claimed is:

1. A silica glass disc, comprising a dimple forming area in which a number of dimples are formed on at least one of a front surface or a back surface of a silica glass body, wherein the dimples in the dimple forming area are regularly formed, wherein the dimples are formed on the front surface and the back surface of the silica glass body.

2. The silica glass disc according to claim 1, wherein the dimples are formed by a laser.

3. The silica glass disc according to claim 1, wherein the silica glass disc has a central portion and a peripheral edge portion that are different in density of the dimples.

4. The silica glass disc according to claim 1, wherein the dimples each have one of an inverted cone shape, an inverted truncated cone shape or a bent shape in which an end of a dimple bottom portion and a dimple side wall are prevented from having a right angle.

5. The silica glass disc according to claim 1, wherein the silica glass body is one of transparent silica glass, white silica glass or black silica glass.

6. The silica glass disc according to claim 1, wherein the dimple forming area on the back surface of the silica glass body is formed at a distance of 10 mm or more from an end portion of the silica glass disc.

7. The silica glass disc according to claim 2, wherein the laser is at least one kind selected from the group consisting of a $CO_2$ laser, a picosecond laser and a femtosecond laser.

8. The silica glass disc according to claim 2, wherein the dimples are formed by causing laser light to scan predetermined points on an XY-axis through use of a galvano scanner.

9. The silica glass disc according to claim 1, wherein, when the silica glass disc is used in a heat treatment process in a vertical heat treatment device, a deformation amount generated at a distal end of the peripheral edge portion of the silica glass disc is 1 mm or less.

10. The silica glass disc according to claim 9, wherein the heat treatment process is a heat treatment process applied when film formation treatment is performed by an ALD method.

11. The silica glass disc according to claim 1, wherein the silica glass disc is used in place of a Si dummy wafer.

12. The silica glass disc according to claim 7, wherein the dimples are formed by causing laser light to scan predetermined points on an XY-axis through use of a galvano scanner.

* * * * *